United States Patent [19]

Powell et al.

[11] 4,439,270
[45] Mar. 27, 1984

[54] PROCESS FOR THE CONTROLLED ETCHING OF TAPERED VIAS IN BOROSILICATE GLASS DIELECTRICS

[75] Inventors: Jimmie L. Powell, Wappingers Falls; Charles L. Standley, Hopewell Junction, both of N.Y.; John Suierveld, San Jose, Calif.

[73] Assignee: International Business Machines Corporation, Armonk, N.Y.

[21] Appl. No.: 521,461

[22] Filed: Aug. 8, 1983

[51] Int. Cl.³ .................... B44C 1/22; C03C 15/00; C03C 25/06
[52] U.S. Cl. .................... 156/644; 156/643; 156/646; 156/653; 156/657; 156/659.1; 156/663; 357/71; 427/89; 430/316; 430/317
[58] Field of Search .............. 156/644, 643, 646, 652, 156/653, 657, 659.1, 662, 663; 430/313, 316, 317; 29/580, 591; 148/187; 427/88, 89, 90; 357/65, 71; 252/79.1, 79.3; 204/192 E

[56] References Cited

U.S. PATENT DOCUMENTS 3,447,984  6/1969  Castrucci et al. ............ 156/644 X
3,483,108  12/1969  Schaefer ........................ 156/657 X Primary Examiner—William A. Powell
Attorney, Agent, or Firm—Sughrue, Mion, Zinn, Macpeak and Seas

[57] ABSTRACT

A process is disclosed for etching openings in a relatively thick layer of borosilicate glass while controlling the degree of taper of the sidewalls of the opening, the taper being in excess of about 45°. The process involves (1) depositing a layer of silicon nitride that contains silicon in an amount in excess of stoichoimetric in $Si_3N_4$, (2) densifying the silicon nitride layer, (3) depositing a layer of resist, (4) exposing and developing the layer of resist to define a desired pattern of openings in the borosilicate glass layer, (5) removing the exposed silicon nitride areas, and (6) subjecting the resultant exposed borosilicate glass surface to an etchant for the glass.

6 Claims, 1 Drawing Figure

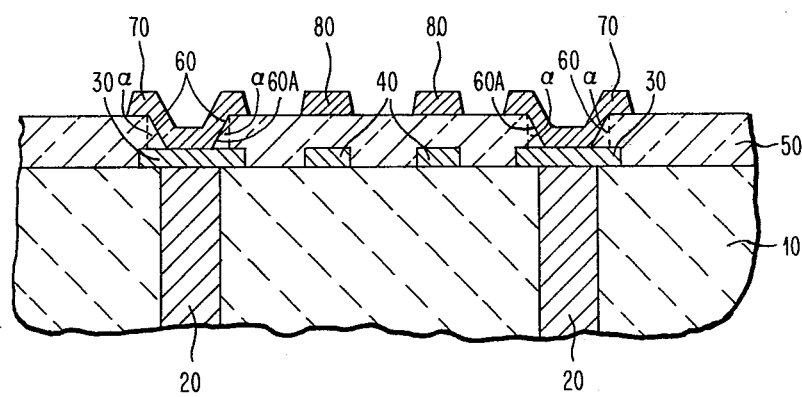

PROCESS FOR THE CONTROLLED ETCHING OF TAPERED VIAS IN BOROSILICATE GLASS DIELECTRICS

BACKGROUND OF THE INVENTION

1. Field of the Invention

The present invention relates to a process for the controlled etching of tapered vias in borosilicate glass dielectrics.

2. Description of the Prior Art

It is known to use low temperature, low pressure plasma deposited silicon nitride layers as a mask in reactive ion etching technology (RIE) technology; however, the silicon nitride layer is used primarily as a mask and/or passivation layer to prevent oxidation and solder bridging between metallurgical lines over portions of the device reserved for active devices. Typically, some silicon nitride is removed prior to oxidation by reactive ion etching (RIE) which leaves a hole with essentially vertical sidewalls. Sloping sidewalls are avoided because of a "birds beak" problem, and the silicon nitride layer is not silicon rich and nitrogen deficient.

IBM Technical Disclosure Bulletin Vol. 24, No. 11A, April 1982, pages 5547 and 5548 discloses reactive ion etching of silicon nitride.

U.S. Pat. No. 3,648,125 Peltzer discloses the use of silicon nitride for diffusion masks and also for forming recessed isolation regions.

U.S. Pat. No. 4,053,351 DeForest et al discloses a method of chemically machining glass and single crystal, polycrystalline and amorphous forms of silica and like materials using acid fluoride etchants.

U.S. Pat. No. 4,247,361 Shaheen discloses the use of a Teflon film as a masking element in semiconductor manufacture.

U.S. Pat. No. 4,299,862 Donley discloses a process of etching windows in a glass coating where a precisely etchable silicon nitride coating can be initially applied and windows precisely etched therein.

U.S. Pat. No. 4,293,376 Weingand discloses a method for manufacturing a perforated glass plate for use in a gas discharge display by providing an etch-resistant coating on a glass plate and subjecting and thus coated glass plate to gaseous hydrofluoric acid.

IBM Technical Disclosure Bulletins Vol. 19, No. 8, January 1977, pages 3039 and 3040 and Vol. 25, No. 1, June 1982, pages 304 and 305 disclose, respectively, barrier layers for multilayer lift-off masks and electron beam mask writing at high exposure doses.

It has been found that standard photoresist masking technology cannot be utilized to produce via holes in multicomponent borosilicate glass layers of substantial thickness. The reason for this is that commonly used organic photoresists for semiconductor fabrication are not chemically durable enough to withstand and attack of etchants as are typically used for complete dissolution of borosilicate glass layers of substantial thicknesses, e.g., on the order of $10\mu$. Although the patterned photoresist is not soluble in the etchants, it floats away from the borosilicate glass dielectric surface (because the HF is known to attach at the interface) in a short period of time, e.g., on the order of 45 seconds, when exposed to the etchant, allowing the borosilicate glass dielectric layer to be attacked in undesired areas, thereby creating pinholing problems and problems with undesired variations in borosilicate glass thickness, both of which could lead to electrical problems in the final thin film redistribution-metal fan-out lines on the glass-on-ceramic surface.

As the resist is loosened as above, the side walls of the via holes become very tapered, i.e., the angle of the hole becomes very shallow because of excess undercutting of the resist, the preferred angle being about 45°, and the taper is uncontrollable.

SUMMARY OF THE INVENTION

In accordance with the present invention, tapered vias can be etched in a thick glass dielectric, for example, on the order of 10 microns ($\mu$), utilizing a plasma deposited nitrogen-deficient silicon nitride film as a masking material.

One object of the present invention is to overcome problems with conventional organic photoresists which are not chemically durable enough to withstand the attack of etchants used for dissolution of a thick glass dielectric layer which leads to pinholing and undesirable thicknesses in the glass dielectric layer which can lead to electrical shorts in the final device.

One further object of the present invention is to provide a process for etching via holes in borosilicate glass where the side walls of the via holes are uniformly and controllably tapered, most preferably the taper being on the order of about 45°, without substantial deviation along the via wall.

BRIEF DESCRIPTION OF THE DRAWINGS

The FIGURE is a side schematic view illustrating, in simplified fashion, a ceramic substrate having vias therein which are metal-filled and having a borosilicate glass dielectric thereon through which the tapered vias of the present invention have been etched.

DESCRIPTION OF PREFERRED EMBODIMENTS

The Dielectrics

The present invention finds application to the etching of borosilicate glasses in general, most particularly with respect to multi-component borosilicate glass dielectrics as are used in the fabrication of semiconductor devices of any type.

While not to be construed as limitative, typical borosilicate glasses which can be etched per the present invention comprise primarily $SiO_2$ and $B_2O_3$, typically on the order of about 65 to about 80 weight parts $SiO_2$, about 20 to about 35 weight parts $B_2O_3$, with up to about 20 weight parts conventional materials as are used in such glass compositions, e.g., one or more of $Al_2O_3$, $Na_2O$, $K_2O$, $CaO$, etc.

A typical multi-component borosilicate glass composition per the present invention has the following composition (all parts are weight parts):

$SiO_2$: 65.0
$B_2O_3$: 20.0
$Al_2O_3$: 7.0
$Na_2O$: 3.0
$K_2O$: 5.0
$CaO$: 1.0

The borosilicate glasses can have varying thicknesses, but, most typically, the present invention finds application in the etching of thick glass layers, on the order of about $10\mu$ up to about 1.0 mil.

Of course, the present invention can be applied to thinner borosilicate glasses, but, in such instances, conventional photoresist materials can be used, whereas the same cannot be used with thick borosilicate glasses.

Borosilicate glass layers etched per the present invention can be formed in a conventional manner as will be appreciated by one skilled in the art. For example, one merely mixes the various desired oxides in the desired proportions and melts them at about 1000° C. to form the desired borosilicate glass, frits the same and forms a layer thereof by a conventional firing procedure.

The Masking Material of the Present Invention

The masking material of the present invention is a plasma deposited, nitrogen-deficient (and accordingly, silicon-rich) silicon nitride (hereafter often merely $Si_3N_4$) film.

By nitrogen-deficient and silicon-rich is meant $Si_3N_4$ that contains silicon in an amount in excess of the stoichiometric amount in $Si_3N_4$. Usually, the amount of silicon (molar) is up to about an Si/N molar ratio of 1.5.

Hereafter when $Si_3N_4$ is referred to, unless otherwise indicated. it is meant to refer to the above nitrogen-deficient, silicon-rich $Si_3N_4$.

While we investigated several inorganic materials as possible masks for etching relatively thick borosilicate glass dielectric layers, due to material processing parameters (heat treatment temperature, durability toward etchant and adhesion to glass and/or $Si_3N_4$) and incompatible thermal properties (the chemical vapor deposition of $Si_3N_4$ is at a temperature which exceeds the glass transition temperature and a CVD deposited $Si_3N_4$ film having too low a refractive index, e.g., 1.5–2.00, is attacked very rapidly by etchant) between the potential masks and the borosilicate glass dielectric layer, we found that only plasma deposited, silicon-rich, nitrogen-poor $Si_3N_4$ which had been heat treated in a reducing atmosphere, and which exhibited a refractive index, after heat treatment, of from about 2.30 to about 2.8, most preferably about 2.5, was a suitable etch mask for borosilicate glass dielectrics.

In this regard, standard plasma deposited $Si_3N_4$ films having a refractive index of equal to or less than 2.0 do not possess the required chemical durability to withstand etchant attack per the present invention.

The Plasma Deposition Conditions

The $Si_3N_4$ film of the present invention is formed by plasma deposition in essentially a conventional manner, except that the amount of silicon in the plasma deposition source is greater than stoichiometric with respect to the amount of nitrogen for $Si_3N_4$. It typically covers the entire surface of the borosilicate glass prior to via etching.

Typical plasma deposition conditions are: temperature of about 300° C.; power of about 300 watts; deposition rate of about 300 A/minute. These conditions can, of course, easily be modified by one skilled in the art using conventional techniques.

$Si_3N_4$ Film Thickness

The $Si_3N_4$ film thickness used for the present invention is not unduly limited. Obviously, the minimum thickness will be established by the particular etchant used and the thickness of the borosilicate glass at issue. Maximum $Si_3N_4$ film thickness is generally set upon a consideration of process steps, e.g., since reactive ion etching is used to form a via pattern in the $Si_3N_4$ film, excess thicknesses should be avoided since this will increase process costs due to the need for greater reactive ion etching times. Accordingly, for any particular application, typically the minimum $Si_3N_4$ film thickness acceptable will be used. Typical preferred $Si_3N_4$ film thicknesses are on the order of about 2,500 Å to about 4,500 Å. Greater or lesser thicknesses can be used so long as excessive microcracking is avoided.

Heat Treatment to Densify the $Si_3N_4$ Film

Per the present invention, the $Si_3N_4$ film is heat treated in a reducing atmosphere to densify the $Si_3N_4$ film.

Typical as deposited refractive indexes are on the order of about 1.95 to about 2.00, and typical final desired refractive indexes are 2.30 to about 2.8, more preferably 2.45 to 2.8 and most preferably about 2.5.

The heat treating conditions are not unduly limited to achieve the desired densification, and typically heating is at a temperature of from about 500° C. to about 535° C. for about 2 hours to about $2\frac{1}{2}$ hours, generally in a reducing gas atmosphere such as, e.g., hydrogen, nitrogen, a nitrogen-hydrogen mixture, etc., and although heat treating can be in air, this is not preferred.

Development of Via Pattern

After formation of the $Si_3N_4$ film of the present invention and densification thereof, a photoresist layer, preferably a composite photoresist layer, is deposited on the silicon nitride film in a conventional manner, exposed through a mask in a conventional manner and then developed in a conventional manner to define the via pattern. The term "composite photoresist layer" merely implies two layers of the same negative photoresist. A composite photoresist layer is preferably used because the photoresist is spin coated and it is difficult to sufficiently expose a single $4\mu$ thick, e.g., layer of photoresist.

The photoresist is not limited in any substantial fashion and any conventional negative photoresist as is used in the art for protecting a surface during conventional reactive ion etching can be used in the present invention.

The use of a composite photoresist layer or double-coated photoresist layer is beneficial because the same is extremely easy to expose and will reduce pin-holing and defects in the borosilicate dielectric glass layer.

Typically, with a composite photoresist layer, the first layer of photoresist is spun on, exposed and developed, whereafter the second layer of photoresist is spun on and exposed and developed, insuring accurate alignment between the two photoresists.

The thickness of the photoresist layer or the thickness of a composite photoresist layer is not unduly limited so long as the photoresist protects the $Si_3N_4$ film during reactive ion etching and during etching of the via holes in the borosilicate glass dielectric layer.

Typical thicknesses for a single photoresist layer will be in the order from about $1\mu$ to about $2\mu$.

For a composite photoresist layer, the first photoresist layer will typically have a dry thickness on the order of about $1.5\mu$ to about $2\mu$ and the second (or overcoat) photoresist layer will have a dry thickness of from about $2\mu$ to about $2.5\mu$.

The above thicknesses are not to be construed as limitative, as one skilled in the art can easily determine useful photoresist layer thicknesses compatible with various reactive ion etching conditions and via hole etching conditions.

Reactive Ion Etching Conditions

Conventional reactive ion etching is used to etch the desired via pattern into the $Si_3N_4$ film of the present invention down to the surface of the borosilicate glass. The photoresist, of course, protects all other areas of the $Si_3N_4$ film from etching. Accordingly, reactive ion etching conditions are merely selected so that the $Si_3N_4$ film is etched and the photoresist is not removed.

Typical conditions are: temperature, on the order of 95° to 100° C., power about 100 watts, etching rate of about 285 Å/minute.

As one skilled in the art will appreciate, the above conditions are not critical and can be freely modified in a conventional manner.

Optional Photoresist Heat Treatment

It is highly preferred that the photoresist, be it a single photoresist layer or a composite photoresist layer, be heat treated under vacuum to render the photoresist more resistant to the borosilicate glass etchant and to protect or cover possible pinholes in the $Si_3N_4$ film.

As will be appreciated by one skilled in the art, baking a photoresist to increase the resistance thereof to chemicals and to essentially densify the same is a well known procedure in the art and conventional conditions can be used for this step of the present invention.

Of course, the exact heating conditions will have to be tailored to any one particular photoresist, but such information is typically readily available from photoresist suppliers.

For a single or composite photoresist layer per the present invention, typically heating is in a slight vacuum, e.g., on the order of about 18 psia to about 20 psia for about 30 minutes to 1.5 hours at a temperature on the order of about 185° C. to about 195° C.

The Wet Etchant and Etching Conditions

The etchant used per the present invention can be freely selected from etchants as are used in the art to etch borosilicate dielectric glasses. Typical etchants include phosphoric acid and acetic acid based etchants, typically in combination with hydrofluoric acid and water. The present invention should not be construed as limited thereto, however.

It is most preferred, however, that the etchant be a relatively rapid etchant for borosilicate glasses, as it is preferred that etching be conducted in a period from about 2 minutes to about 5 minutes.

Typically etching is conducted at a temperature of about 20° C. to about 25° C. at normal pressure.

During the etching step the $Si_3N_4$ adheres firmly to the borosilicate glass, but is slowly etched away, thereby enlarging the via openings. This etching away of the $Si_3N_4$ layer permits an additional area of the upper portion of the borosilicate glass layer to be exposed to the etchant which provides additional taper. The amount of additional exposed borosilicate glass is precisely controlled and governed by the $Si_3N_4$ layer. As one skilled in the art will appreciate, in wet etching undercutting will always take place; however, per the present invention the excellent adhesion of the $Si_3N_4$ to the borosilicate glass dielectric controls the undercutting in a precise fashion.

Following etching, the device at this stage is rinsed, e.g., with deionized water, and then blow-dried with a suitable inert gas, e.g., nitrogen, argon, helium, etc, though clean air can also be used.

As will be appreciated by one skilled in the art, the exact taper for the via holes through the borosilicate glass dielectric layer can be substantially varied. However, it is most preferred that the taper be in excess of 45° C., the same generally ranging from about 45° to about 60°.

As shown in the FIGURE, the term "taper" as used herein refers to the angle $\alpha$ as shown in the FIGURE. $\alpha$ should be, as indicated, on the order of about 45° to about 60°, more preferably 45° to 50°. If the angle is too great, the metal deposited in the vias will not adhere well thereto. On the other hand, if the angle $\alpha$ is too low, overlap can occur with adjacent vias or metallization lines, leading to shorting.

With reference to the FIGURE, there is shown therein a ceramic substrate 10 which is shown provided with metal vias 20 which are, in turn, overcoated with a metallization pattern 30; also shown are metallization lines 40. Borosilicate glass layer 50 is also shown which has etched therein tapered via holes 60 provided with a metallization pattern 70 therein and metallization lines 80 thereon. The vias may be Mo and the metallization Cr-Cu-Cr. Except for the tapered vias, the above represents a conventional device intermediate.

As one skilled in the art will appreciate, various passivating layers, additional metal connections and the like can be provided in the manner which will be apparent to one skilled in the art.

In accordance with the present invention, for example with a via hole having a bottom diameter of 2 mils and a top diameter of 4 mils, in which case the metal in the via hole would be about $5\mu$ deep, it is preferred that any pitting in the side of the via, i.e., any erosion near the side of the via, be no greater than 5 microns in depth to avoid any break in the continuity of the metal in the via; an excessively deep pit could lead to this break in the continuity of the metal in the via.

It is the sidewall 60a where pitting or erosion can create a problem and where taper must be substantially uniform, i.e., pits more than about $5\mu$ deep can lead to a continuity problem and should be avoided per the present invention.

Secondary Processing

Following processing as above, residual photoresist is removed in a conventional manner, e.g., by oxygen reactive ion etching, whereafter the $Si_3N_4$ film is removed using conventional reactive ion etching, e.g., in $CF_4$ down to the surface of the borosilicate glass. Etching is terminated using a conventional end point detector.

Following processing as above, the device, with appropriately etched via holes in the borosilicate glass dielectric layer, can be subjected to various conventional treatments such as cleaning, filling of the via holes, application of metallization, for example, Cr-Cu-Cr metallization, etching away of the top Cr layer of the metallization, etc., all of which are conventional.

Having thus generally described the invention, the following example is offered of the currently preferred best mode of practicing the invention.

EXAMPLE

In this particular instance, a conventional $10\mu$ thick layer of borosilicate glass dielectric was formed in a conventional manner on a conventional two layer structure comprising an $Al_2O_3$ substrate having a metallization pattern of chromium-copper-chromium.

The borosilicate glass dielectric layer had the following composition (all parts are weight parts):

$SiO_2$: 65.0
$B_2O_3$: 20.0
$Al_2O_3$: 7.0
$Na_2O$: 3.0
$K_2O$: 5.0
$CaO$: 1.0

It was formed by sedimenting the glass composition which was in the form of a frit having a particle size of about $8\mu$ and then sintered in a hydrogen atmosphere at 820° C. for one hour. The surface of the glass was then planarized in a conventional fashion to render the same flat $\pm 2\mu$.

The borosilicate glass dielectric layer was then cleaned with a conventional neutral cleaning solution followed by ashing in an oxygen atmosphere in a manner conventional in the art.

The nitrogen-deficient, silicon-rich $Si_3N_4$ layer was then plasma deposited onto the clean surface of the borosilicate glass dielectric layer. The $Si_3N_4$ layer had a thickness in the 4,000 to 5,000 angstrom range. It had a refractive index less than 2.3

Plasma deposition was conducted at about 300° C., using a power of about 300 watts and at an $Si_3N_4$ deposition rate of about 300 Å/minute.

After deposition of the $Si_3N_4$ layer, the assembly was introduced into a furnace and treated in a hydrogen atmosphere at approximately one atmosphere at 525° C. for two hours to densify the $Si_3N_4$ film, after densification the $Si_3N_4$ film exhibiting a refractive index of about 2.5.

After removal from the furnace and cooling to room temperature, a composite (dual) layer of a conventional negative photoresist was spun on in a conventional manner. The upper and lower layers of the photoresist were the same and both layers had a dry thickness of $2\mu$.

Following each coating, the individual composite photoresist layers were exposed through an appropriate mask for the desired via pattern and developed in a conventional manner to remove the photoresist where the via holes are to be etched. The via hole "openings" in the photoresist had an initial diameter of about 2 mils.

Nextly, a conventional reactive ion etching was conducted in $CF_4$ to etch the via pattern into the $Si_3N_4$ film down to the surface of the borosilicate glass dielectric. A conventional end point detector was used to terminate reactive ion etching. Reactive ion etching was at a temperature of 95°–100° C., a power of 100 watts and at an etch rate of 285 Å/minute.

Following reactive ion etching, the device at this stage was heated in a vacuum furnace at a vacuum of 18–20 psia at 185° to 195° C. for one-half hour to make the composite photoresist layer more resistant to the etchant and to cover possible pinholes in the $Si_3N_4$ film.

Following the above heat treating, and permitting the device to cool to room temperature, the via holes were etched in the borosilicate glass dielectric layer by immersing the same in the etchant 35.3% HF-23.5% glacial acetic acid-41.2% $H_2O$. Etching was conducted at 24° C. for from 2.5–3.0 minutes, whereafter the device was removed from the etchant solution, rinsed in running deionized water for 5 minutes and then blow-dried with nitrogen.

The via holes had a taper of 45°, a diameter of 2 mils at the bottom of the via holes and 4 mils at the top of the via holes and showed no substantial pits or erosion.

Following the above procedure, residual photoresist was removed by conventional reactive ion etching in any oxygen plasma and then the $Si_3N_4$ film was reactive ion etched away down to the surface of the borosilicate glass dielectric layer by a conventional $CF_4$ reactive ion etching. A conventional end point detector was used to determine when to terminate the reactive ion etching.

Following the above described processing, the desired via holes were obtained in the borosilicate glass dielectric without any problem resulting from an unacceptable pinhole density.

The device at this stage is ready for further conventional processing, as desired, e.g., deposition of conventional metallurgy in the tapered via holes, e.g., 5 microns of copper, etc.

While there have been described what are at present considered to be the preferred embodiments of this invention, it will be obvious to those skilled in the art that various changes and modifications may be made therein without departing from the invention, and it is, therefore, intended to cover all such changes and modifications as fall within the true spirit and scope of the invention.

We claim:

1. A process for etching openings in a relatively thick layer of borosilicate glass while controlling the degree of taper of the side walls of the opening, the taper being in excess of about 45°, which process comprises:
   depositing a layer of silicon nitride that contains silicon in an amount in excess of stoichoimetric in $Si_3N_4$,
   densifying the silicon nitride layer,
   depositing a layer of resist,
   exposing and developing the layer of resist to define a desired pattern of openings in the borosilicate glass layer,
   removing the exposed silicon nitride areas, and
   subjecting the resultant exposed borosilicate glass surface to an etchant for the glass.

2. The process of claim 1 wherein the taper is at least about 45°.

3. The process of claim 1 wherein the taper is at least about 45° to 60°.

4. The process of claim 1 wherein the taper is about 50°.

5. The process of claim 1 wherein the refractive index of the densified silicon nitride layer is 2.3 to about 2.8.

6. The process of claim 1 wherein the refractive index of the densified silicon nitride layer is about 2.5.

* * * * *